(12) United States Patent
Hiroyama et al.

(10) Patent No.: US 6,778,575 B2
(45) Date of Patent: Aug. 17, 2004

(54) ALGAINP-BASED HIGH-OUTPUT RED SEMICONDUCTOR LASER DEVICE

(75) Inventors: Ryoji Hiroyama, Kyo-tanabe (JP); Daijiro Inoue, Kyoto (JP); Yasuhiko Nomura, Moriguchi (JP); Kunio Takeuchi, Jyoyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/100,920

(22) Filed: Mar. 20, 2002

(65) Prior Publication Data

US 2002/0181528 A1 Dec. 5, 2002

(30) Foreign Application Priority Data

Mar. 22, 2001 (JP) ........................................ 2001-082427

(51) Int. Cl.$^7$ .............................................. G01R 23/02
(52) U.S. Cl. ........................................... 372/45; 372/50
(58) Field of Search ............................. 372/43, 45, 50; 438/40

(56) References Cited

U.S. PATENT DOCUMENTS

| 5,436,194 A | * | 7/1995 | Kondo et al. ................. 438/40 |
| 5,862,166 A | * | 1/1999 | Anayama ..................... 372/43 |
| 5,982,799 A | * | 11/1999 | Bour et al. ................... 372/50 |

OTHER PUBLICATIONS

Satoshi Arimoto et al., Jun. 1993, IEEE Journal of Quantum Electronics. vol. 29, No. 6, p. 1874–1877.*
Arimoto, et al "150 mW Fundamental–Transverse–Mode Operation of 670 nm Window Laser Diode" IEEE Journal of Quantum Electronics, vol. 29, No. 6, Jun. 1993, pp. 1874–1877.
Kobayashi, et al "Low–Threshold, Highly Reliable 630nm–Band AlGaIP Visible Laser Diodes With AlInp Buried Waveguide" Electronics Letters, vol. 32, No. 10, May 9, 1996, pp. 894–896.

M. Kato, et al "Low–Operating–Current, High–Power, 660nm Laser Diodes for DVD–RAM" Fifth Optoelectronics and Communications Conference (OECC 2000) Technical Digest, Jul. 2000, pp. 534–535.

* cited by examiner

*Primary Examiner*—Don Wong
*Assistant Examiner*—Hung Tran Vy
(74) *Attorney, Agent, or Firm*—McDermott Will & Emery LLP

(57) ABSTRACT

A semiconductor laser device having a real refractive index guided structure capable of obtaining a high kink light output and a high maximum light output also when a vertical beam divergence angle is at a small level of at least 12.5° and not more than 20.0° is provided. This semiconductor laser device comprises an n-type cladding layer of AlGaInP formed on an n-type GaAs substrate, an active layer having an AlGaInP layer formed on the n-type cladding layer, a p-type cladding layer of AlGaInP formed on the active layer and a light confinement layer formed to partially cover the p-type cladding layer, and a vertical beam divergence angle is at least 12.5° and not more than 20.0°. Thus, a higher kink light output and a higher maximum light output can be obtained as compared with a conventional semiconductor laser device having a vertical beam divergence angle exceeding 20.0°.

15 Claims, 4 Drawing Sheets

ALGAINP-BASED HIGH-OUTPUT RED SEMICONDUCTOR LASER DEVICE

BACKGROUND OF THE INVENTION

1. Field of the Invention

The present invention relates to a semiconductor laser device, and more particularly, it relates to an AlGaInP-based high-output red semiconductor laser device.

2. Description of the Prior Art

An AlGaInP-based high-output red semiconductor laser device is generally known as a semiconductor laser device applicable to a recordable DVD system or the like. In order to improve the recording speed in the recordable DVD system, the intensity of a laser beam applied to the disk must be improved. In order to improve the intensity of the laser beam applied to the disk, the coupling efficiency between an objective lens for focusing the beam on the disk and the laser beam must be improved while the output of the semiconductor laser device as the light source must be increased.

Improvement of the coupling efficiency between the objective lens and the laser beam is now studied. In general, the objective lens is provided in response to an angle of horizontal divergence of the laser beam, and hence a vertical laser beam component having a larger angle than the horizontal divergence angle is applied outward beyond the objective lens. In this case, the coupling efficiency between the objective lens and the laser beam is reduced. In order to improve the coupling efficiency between the objective lens and the laser beam, therefore, the vertical beam divergence angle must be reduced. In other words, the ratio of the vertical beam divergence angle to the horizontal beam divergence angle (aspect ratio: vertical beam divergence angle/horizontal beam divergence angle) must be approached to 1.0 with respect to an active layer of the semiconductor laser device.

In order to increase the output of the semiconductor laser device, the level of COD (catastrophic optical damage: deterioration of an end face emitting the laser beam) must indispensably be improved. It is known that COD is caused in the following cycle: When a current is injected in a laser end face having surface states in high density, non-radiative recombination results through the surface states. Therefore, the laser end face generates heat. An energy gap is reduced in the active layer on the laser end face due to this heat, to increase light absorption. Thus, heat is further generated. The temperature of the laser end face is increased due to this cycle, whereby crystals are fused to break the laser end face as a result.

A method employing a window structure by Zn diffusion is generally known as a method of suppressing such COD. This method is disclosed in IEEE Journal of Quantum Electronics, Vol. 29, No. 6, pp. 1874 to 1877 (1993), for example. In the conventional method employing a window structure, an impurity is introduced into a region of an active layer of a laser device close to a cavity end face thereby disordering a quantum well structure of the active layer. Therefore, a band gap of the region of the active layer close to the cavity end face is spread as compared with the remaining regions, thereby reducing light absorption on the cavity end face. Thus, temperature increase can be suppressed on the laser end face, thereby suppressing COD.

A method of reducing optical density on a portion of an active layer close to a cavity end face by enlarging the area of an emission spot is also known as another method of suppressing COD. In this case, the area of the emission part is so enlarged as to reduce the vertical beam divergence angle.

When the vertical beam divergence angle is reduced, a kink (bend of a current-light output characteristic) originating from higher transverse mode hardly results. When the vertical beam divergence angle is reduced, therefore, not only suppression of the aforementioned COD but also improvement of the light output can be attained.

In general, the output of the semiconductor laser must be increased along with improvement of the coupling efficiency between the objective lens and the laser beam in order to improve the intensity of the laser beam applied to the disk, as hereinabove described. In order to improve the coupling efficiency between the objective lens and the laser beam, the aspect ratio, i.e., the ratio of the vertical beam divergence angle to the horizontal beam divergence angle, must be reduced. In order to increase the output of the semiconductor laser device, the COD level or the kink level must be improved. It is generally known that the aspect ratio can be reduced, and the COD and kink levels can be improved by reducing the vertical beam divergence angle. In order to reduce the vertical beam divergence angle, the emission spot may be enlarged.

When the emission spot is enlarged in a conventional semiconductor laser device having a loss guided structure confining transverse light by absorbing light in a current blocking layer in order to reduce the vertical beam divergence angle, however, light absorption in the current blocking layer is increased to reduce inclination (slope efficiency) of the current-light output characteristic. Therefore, an operating current for obtaining a constant light output is disadvantageously increased. When the operating current is increased, light output is readily saturated (light output thermal saturation) by heat generation, and hence it is difficult to improve the light output. Thus, it is difficult to increase the output by reducing the vertical beam divergence angle in the conventional semiconductor laser device having a loss guided structure.

To this end, generally known is a method of reducing light absorption in a current blocking layer through a real refractive index guided structure transparentizing the current blocking layer with respect to a laser beam. According to this real refractive index guided structure, a light confinement layer consisting of a material having a smaller refractive index than a cladding layer is provided to cover the side surfaces of the cladding layer of a ridge portion thereby confining transverse light due to difference between refractive indices. Thus, the current blocking layer absorbs no light, to hardly cause light output thermal saturation resulting from light absorption in the current blocking layer.

When the area of an emission spot is enlarged for reducing the vertical beam divergence angle in a conventional semiconductor laser device having such a real refractive index guided structure, however, the ratio of the light component (optical confinement factor) present in the portion of the active layer to the overall area of the light is reduced. Therefore, the light hardly attains a gain, leading to difficulty in lasing. It is known that a threshold current is thus increased to increase an operating current, readily leading to light output thermal saturation.

Thus, when the emission spot is enlarged for reducing the vertical beam convergence angle in the conventional laser device having a real refractive index guided structure, light output thermal saturation readily results from reduction of the optical confinement factor although light output thermal saturation hardly results from light absorption in the current blocking layer, and hence it has been regarded as difficult to improve a kink light output and obtain a high maximum light output. Consequently, there has been developed no red laser device of a real refractive index guided structure having a low aspect ratio with a vertical beam divergence angle of not more than 20.0°.

SUMMARY OF THE INVENTION

An object of the present invention is to provide a semiconductor laser device having a real refractive index guided structure capable of obtaining a high kink light output and a high maximum light output also when reducing a vertical beam divergence angle.

Another object of the present invention is to implement a low aspect ratio in the aforementioned semiconductor laser device.

Noting the aforementioned point, the inventors have made various experiments and deep study, to find out that a high kink light output and a high maximum light output can be obtained in a semiconductor laser device having a real refractive index guided structure also when a vertical beam divergence angle is set to a small level of at least 12.5° and not more than 20.0°. The present invention is now described.

According to a first aspect of the present invention, a semiconductor laser device having a real refractive index guided structure comprises an n-type cladding layer of AlGaInP formed on an n-type GaAs substrate, an active layer having an AlGaInP layer formed on the n-type cladding layer, a p-type cladding layer of AlGaInP formed on the active layer and a light confinement layer formed to partially cover the p-type cladding layer, and a vertical beam divergence angle is at least 12.5° and not more than 20.0°.

According to the first aspect, the real refractive index guided semiconductor laser device is so structured that the vertical beam divergence angle is at least 12.5° and not more than 20.0° as hereinabove described, whereby a higher kink light output and a higher maximum light output can be obtained as compared with a conventional semiconductor laser beam device having a vertical beam divergence angle exceeding 20.0°.

In the aforementioned semiconductor laser device according to the first aspect, the vertical beam divergence angle is preferably an angle exhibiting thermal saturation before a laser beam emitting end face is deteriorated. When the vertical beam divergence angle is set to such an angle, the laser beam emitting end face can be prevented from deterioration (COD). In this case, the vertical beam divergence angle is preferably smaller than 18°. More preferably, the vertical beam divergence angle is at least 12.5° and not more than 17.0° in this case. This range of at least 12.5° and not more than 17.0° has been experimentally confirmed as a range causing no deterioration of the laser beam emitting end face (COD) in practice, and hence the laser beam emitting end face can be reliably prevented from deterioration (COD) when the vertical beam divergence angle is set within this range.

In the aforementioned case, the vertical beam divergence angle is preferably at least 15.5°. At this lower limit angle of 15.5°, a light output substantially identical to that at an angle of 18.0° causing deterioration (COD) of the laser beam emitting end face with the maximum light output can be obtained with neither deterioration (COD) of the laser beam emitting end face nor kink, and hence a higher light output can be obtained by setting the vertical beam divergence angle to at least 15.5°.

In the aforementioned semiconductor laser device according to the first aspect, the n-type cladding layer or the p-type cladding layer having a smaller thickness is preferably at least 1.5 μm and not more than 2.5 μm in thickness. According to this structure, a semiconductor laser device having a vertical beam divergence angle of at least 12.5° and not more than 15.0° can be readily obtained.

In the aforementioned semiconductor laser device according to the first aspect, the active layer preferably includes a light guide layer and a barrier layer, for adjusting the vertical beam divergence angle by changing at least either the Al composition of the light guide layer and the barrier layer or the thickness of the light guide layer. According to this structure, the vertical beam divergence angle can be readily adjusted without changing the degree of carrier confinement in the active layer and without remarkably changing the lasing wavelength.

In the aforementioned semiconductor laser device according to the first aspect, the active layer preferably includes a light guide layer and a barrier layer, the composition ratio Al/(Al+Ga) of the light guide layer and the barrier layer is preferably at least 0.39 and not more than 0.67, and the thickness of the light guide layer is preferably at least 15 nm and not more than 25 nm. According to this structure, a semiconductor laser device having a vertical beam divergence angle of at least 12.5° and not more than 20.0° can be readily obtained.

In the aforementioned semiconductor laser device according to the first aspect, the active layer preferably has a quantum well structure, and an impurity is preferably introduced into a region of the active layer close to a cavity end face thereby disordering the quantum well structure and widening a band gap as compared with the remaining regions. According to this structure, absorption of a laser beam is suppressed in the vicinity of the end face, whereby the end face can be inhibited from generating heat. Thus, the laser beam emitting end face can be effectively prevented from deterioration (COD), whereby a high maximum light output can be obtained.

The aforementioned semiconductor laser device according to the first aspect preferably has a maximum light output of at least 150 mW. According to this structure, a semiconductor laser device having a higher maximum light output than the conventional device can be obtained.

According to a second aspect of the present invention, a semiconductor laser device having a real refractive index guided structure comprises an n-type cladding layer of AlGaInP formed on an n-type GaAs substrate, an active layer having an AlGaInP layer formed on the n-type cladding layer, a p-type cladding layer of AlGaInP formed on the active layer and a light confinement layer formed to partially cover the p-type cladding layer, while the n-type cladding layer or the p-type cladding layer having a smaller thickness is at least 1.5 μm and not more than 2.5 μm in thickness, and a vertical beam divergence angle is at least 12.5° and not more than 15.0°.

According to the second aspect, the real refractive index guided semiconductor laser device is so structured that the vertical beam divergence angle is at least 12.5° and not more than 15.0° as hereinabove described, whereby a higher maximum light output can be obtained as compared with a conventional semiconductor laser device having a vertical beam divergence angle exceeding 20.0° and a low aspect ratio can be implemented.

According to a third aspect of the present invention, a semiconductor laser device having a real refractive index guided structure comprises an n-type cladding layer of AlGaInP formed on an n-type GaAs substrate, an active layer having an AlGaInP layer formed on the n-type cladding layer, a p-type cladding layer of AlGaInP formed on the active layer and a light confinement layer formed to partially cover the p-type cladding layer, and a vertical beam divergence angle is at least 15.0° and not more than 20.0°.

According to the third aspect, the real refractive index guided semiconductor laser device is so structured that the vertical beam divergence angle is at least 15.0° and not more than 20.0° as hereinabove described, whereby a higher kink light output and a higher maximum light output can be obtained as compared with the conventional semiconductor laser device having a vertical beam divergence angle exceeding 20.0°.

In the aforementioned semiconductor laser device according to the third aspect, the vertical beam divergence angle is preferably smaller than 18°. When the vertical beam divergence angle is set to such a level, a laser beam emitting end face can be prevented from deterioration (COD). In this case, the vertical beam divergence angle is more preferably at least 15.0° and not more than 17.0°. This range of at least 15.0° and not more than 17.0° has been confirmed as causing no deterioration (COD) of the laser beam emitting end face in practice, and hence the laser beam emitting end face can be reliably prevented from deterioration (COD) when the vertical beam divergence angle is set within this range.

In the aforementioned semiconductor laser device according to the third aspect, the active layer preferably has a quantum well structure, and an impurity is preferably introduced into a region of the active layer close to a cavity end face thereby disordering the quantum well structure and widening a band gap as compared with the remaining regions. According to this structure, absorption of a laser beam is suppressed in the vicinity of the end face, whereby the end face can be inhibited from generating heat. Thus, the laser beam emitting end face can be effectively prevented from deterioration (COD), whereby a high maximum light output can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
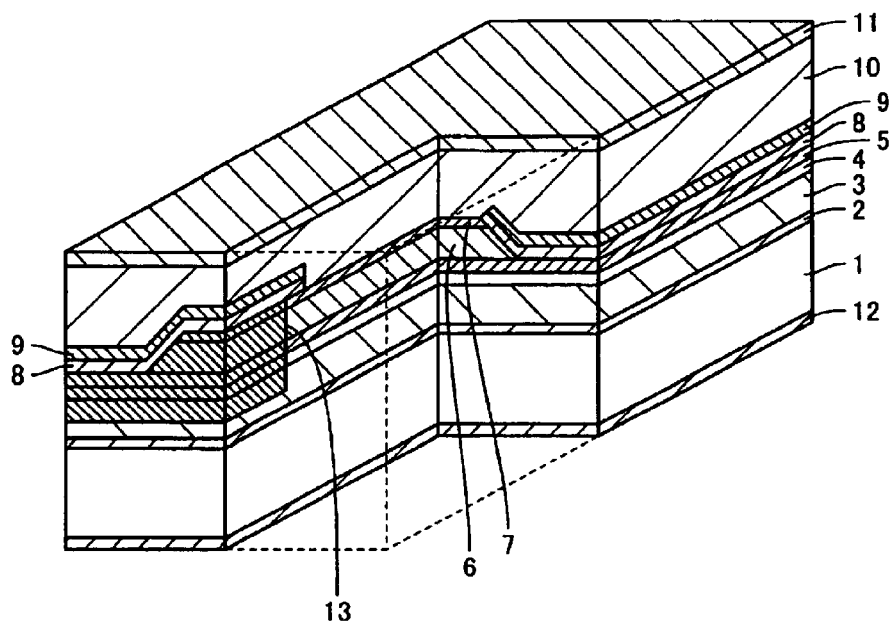
FIG. 1 is a perspective view showing the structure of a semiconductor laser device according to a first embodiment of the present invention.
Figure 2:
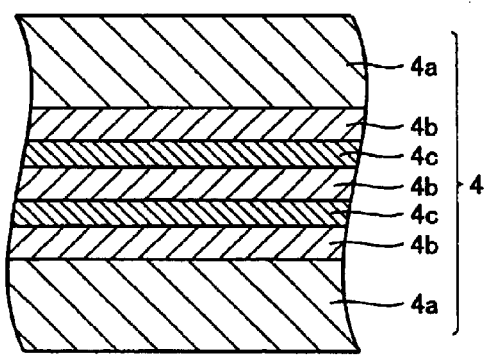
FIG. 2 is a sectional view showing the structure of an active layer of the semiconductor laser device according to the first embodiment of the present invention.

The structure of a semiconductor laser device according to a first embodiment of the present invention is described with reference to FIG. 1. In the semiconductor laser device according to the first embodiment, a buffer layer 2 of n-type GaInP doped with Si and an n-type cladding layer 3 of $(Al_{0.7}Ga_{0.3})InP$, doped with Si, having a thickness of about 2.0 $\mu$m are formed on an n-type GaAs substrate 1. The dose of Si introduced into the n-type cladding layer 3 is $3 \times 10^{17}$ cm$^{-3}$. An active layer 4 having a quantum well structure is formed on the n-type cladding layer 3. As shown in FIG. 2, the active layer 4 has a strain compensation multiple quantum well structure obtained by alternately stacking three well layers 4b of $Ga_{0.43}In_{0.57}P$ having a thickness of about 8 nm and two barrier layers 4c of $(Al_xGa_{1-x})_{0.58}In_{0.42}P$ having a thickness of about 5 nm between two light guide layers 4a of $(Al_xGa_{1-x})InP$ having a thickness of t nm. Compressive strain of the well layers 4b is about 0.5%, and tensile strain of the barrier layers 4c is about 0.5%.

A p-type first cladding layer 5 of $(Al_{0.7}Ga_{0.3})InP$ doped with Zn and a p-type second cladding layer 6 of $(Al_{0.7}Ga_{0.3})$InP doped with Zn are formed on the active layer 4. The p-type second cladding layer 6 is provided in the form of a trapezoid having a thickness of about 1.3 $\mu$m. A p-type contact layer 7 of GaInP, doped with Zn, having a thickness of about 0.1 $\mu$m is formed to be in contact with the overall upper surface of the p-type second cladding layer 6. The dose of Zn introduced into the p-type first cladding layer 5, the p-type second cladding layer 6 and the p-type contact layer 7 is $1 \times 10^{18}$ cm$^{-3}$. The p-type second cladding layer 6 and the p-type contact layer 7 form a ridge portion having a width of about 2.5 $\mu$m to about 3.5 $\mu$m. The p-type first cladding layer 5 and the p-type second cladding layer 6 are examples of the "p-type cladding layer" according to the present invention.

An n-type light confinement layer 8 of AlInP, doped with Se, having a thickness of about 0.5 $\mu$m and an n-type current blocking layer 9 of GaAs, doped with Se, having a thickness of about 0.3 $\mu$m are formed to cover the upper surface of the p-type first cladding layer 5, the side surfaces of the p-type second cladding layer 6 and the side surfaces of the p-type contact layer 7. The n-type light confinement layer 8, provided to transversely control a laser beam, consists of a material (AlInP) having a smaller refractive index than $(Al_{0.7}Ga_{0.3})InP$ forming the p-type second cladding layer 6. Thus, the semiconductor laser device according to the first embodiment is formed to have a real refractive index guided structure. The n-type current blocking layer 9 is provided for inhibiting a current from flowing to the ridge portion. The n-type light confinement layer 8 is an example of the "light confinement layer" according to the present invention.

Zn is introduced into portions of the n-type cladding layer 3, the active layer 4, the p-type first cladding layer 5, the p-type second cladding layer 6 and the p-type contact layer 7 close to a cavity end face as an impurity, thereby forming a Zn diffusion region 13. Therefore, the quantum well structure is disordered in the region (the Zn diffusion region 13) of the active layer 4 close to the cavity end face due to Zn diffusion. Thus, a window structure is formed to enlarge the band gap in the region of the active layer 4 close to the cavity end face as compared with those of the remaining portions. The n-type light confinement layer 8 and the n-type current blocking layer 9 are formed on the upper surface of the ridge portion of the Zn diffusion region 13, for suppressing unnecessary current injection into the window region.

A p-type cap layer 10 of GaAs, doped with Zn, having a thickness of about 3.0 μm is formed on the n-type current blocking layer 9, to be in contact with the upper surface (the n-type contact layer 7) of the ridge portion excluding the region close to the cavity end face. The dose of Zn introduced into the p-type cap layer 10 is $1 \times 10^{19}$ cm$^{-3}$. A p-side electrode 11 is formed on the p-type cap layer 10. An n-side electrode 12 is formed on the back surface of the n-type GaAs substrate 1.

Table 1 shows Al compositions (x) of the light guide layers 4a and the barrier layers 4c, thicknesses (t) of the light guide layers 4a and vertical beam divergence angles obtained through these Al compositions and thicknesses.

Figure 3:
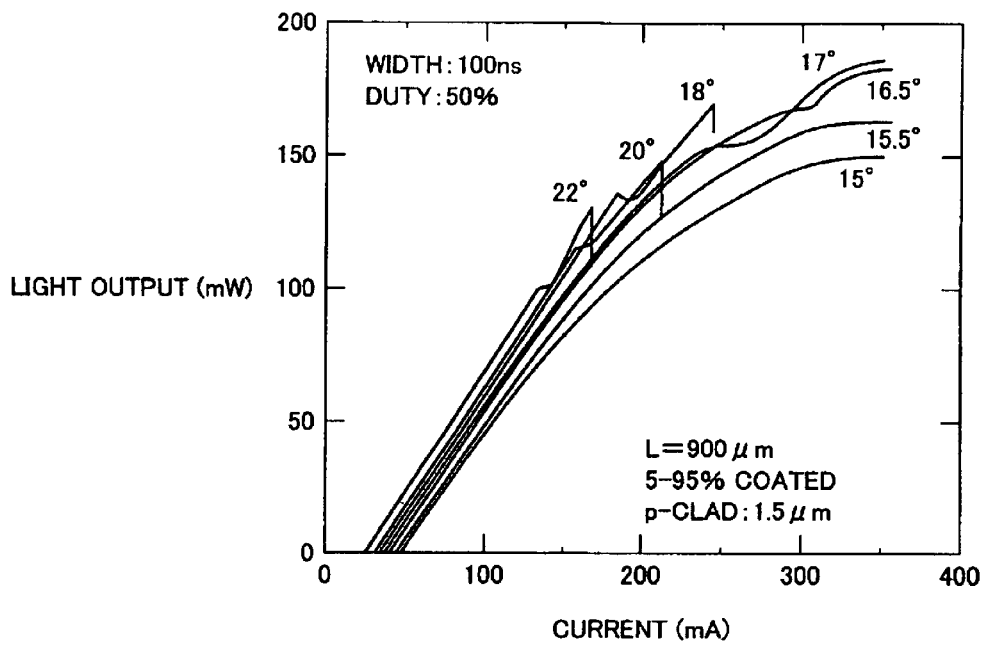
FIG. 3 is a characteristic diagram showing current-light output characteristics of samples of the semiconductor laser device according to the first embodiment of the present invention and a conventional (comparative) semiconductor laser device.

As shown in FIG. 3, the maximum light output of the conventional (comparative) semiconductor laser device having the vertical beam divergence angle of 22.0° is limited to about 130 mW due to COD. On the other hand, it has been proved that COD levels of samples having vertical beam divergence angles of 20.0° and 18.0° were improved as compared with the COD level of the conventional semiconductor laser device having the vertical beam divergence angle of 22.0° among samples of the semiconductor laser device according to the first embodiment having vertical beam divergence angles of 15.0° to 20.0°. More specifically, it was possible to obtain COD levels of at least about 150 mW in the samples having the vertical beam divergence angles of 20.0° and 18.0°. Therefore, it has been found that higher maximum light outputs can be obtained in the samples of the semiconductor laser device according to the first embodiment having the vertical beam divergence angles of 20.0° and 18.0° as compared with the conventional (comparative) semiconductor laser device having the vertical beam divergence angle of 22.0°.

When the vertical beam divergence angle is at least 15.0° and not more than 17.0°, thermal saturation precedes COD. In this case, it has been proved that samples having vertical beam divergence angles of 15.0° to 17.0° obtained higher maximum light outputs (about 150 mW to about 175 mW) than the conventional semiconductor laser device having the divergence angle of 22.0°. The sample having the vertical beam divergence angle of 17.0° obtained a higher kink light

TABLE 1

| Thickness of Light Guide Layer(nm): t | 20 | 25 | 15 | 20 | 15 | 15 | 20 | 15 | 15 | 20 | 15 |
|---|---|---|---|---|---|---|---|---|---|---|---|
| Al Composition of Light Guide Layer (Barrier Layer): x | 0.39 | 0.45 | 0.45 | 0.50 | 0.51 | 0.54 | 0.59 | 0.56 | 0.60 | 0.66 | 0.62 |
| Vertical Beam Divergence Angle (°) | 22.0 |  | 20.0 |  | 18.0 | 17.0 |  | 16.5 |  | 15.5 | 15.0 |

Referring to Table 1, either the Al compositions (x) of the light guide layers 4a and the barrier layers 4c or the thicknesses of the light guide layers 4a were varied for adjusting the vertical beam divergence angles in relation to the first embodiment. Samples of the semiconductor laser device according to the first embodiment having vertical beam divergence angles of 15.0° to 20.0° and a conventional (comparative) semiconductor laser device having a vertical convergence angle of 22.0° were prepared for investigating current-light output characteristics and reliability of the samples.

The current-light output characteristics of the samples of the semiconductor laser device according to the first embodiment and the conventional (comparative) semiconductor laser device are described with reference to FIG. 3. Thicknesses of p-type first cladding layers 5 were varied to attain constant transverse refractive index difference regardless of vertical beam convergence angles, thereby adjusting horizontal beam convergence angles of all samples to about 10°. More specifically, the thicknesses of the p-type first cladding layers 5 were set to about 0.2 μm. The current-light output characteristics shown in FIG. 3 were measured under conditions of an operating pulse width (pulse width) of 100 ns, an operating pulse ratio (duty) of 50%, a cavity length (L) of 900 μm and reflectivity of 5% and 95% on front and back sides of emission surfaces.

output and a higher maximum light output as compared with the conventional semiconductor laser device having the divergence angle of 22.0° although a kink preceded thermal saturation. The sample having the vertical beam divergence angle of 16.5° obtained a higher kink light output as compared with the sample having the vertical beam divergence angle of 17.0°. The samples having the vertical beam divergence angles of 15.0° and 15.5° obtained maximum light outputs with neither COD nor kink. In particular, the sample having the vertical beam divergence angle of 15.5° obtained a maximum light output substantially equivalent to the sample having the vertical beam divergence angle of 18° exhibiting COD at the maximum light output.

As hereinabove described, it has been proved that the semiconductor laser device according to the first embodiment having the vertical beam divergence angle of at least 15.0° and not more than 20.0° obtains a higher kink light output and a higher maximum light output as compared with the conventional semiconductor laser device having the vertical beam divergence angle of 22.0°.

Results of a reliability test on the sample of the semiconductor laser device according to the first embodiment having the vertical beam divergence angle of 16.5° obtaining a high kink light output and a high maximum light output in the current-light output characteristics shown in FIG. 3 and the conventional (comparative) semiconductor laser device having the vertical beam divergence angle of 22.0° are now described with reference to FIG. 4. This reliability test was performed under conditions of a temperature of 60° C., a pulse of 90 mW, a pulse width of 100 ns and a duty of 50%.

Figure 4:
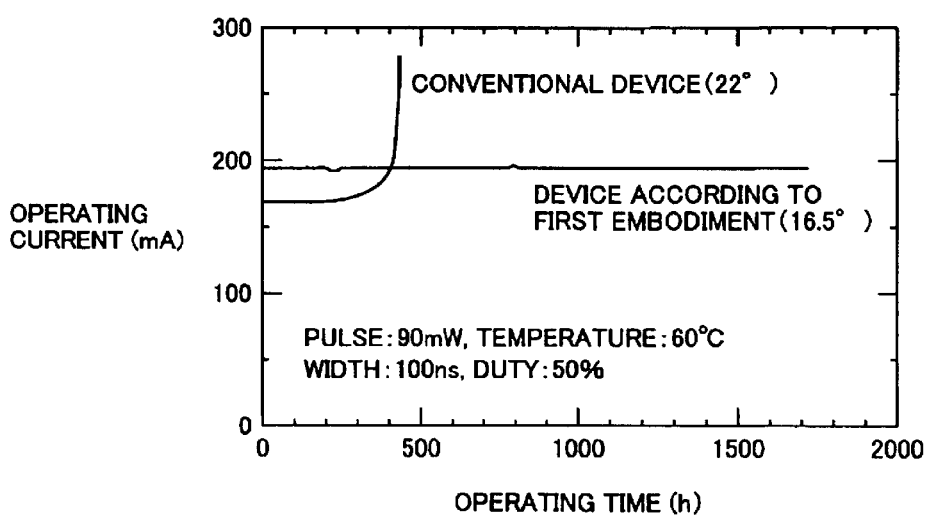
FIG. 4 is a characteristic diagram showing the results of a reliability test of the semiconductor laser device according to the first embodiment of the present invention and the conventional (comparative) semiconductor laser device.

As shown in FIG. 4, it has been recognized that the conventional (comparative) semiconductor laser device having the vertical beam divergence angle of 22.0° broke down after a lapse of an operating time of about 500 hours, while the semiconductor laser device having the vertical beam divergence angle of 16.5° according to the first embodiment stably operated at least 1700 hours with a substantially constant operating current. Thus, it has been proved that the semiconductor laser device according to the first embodiment is superior in reliability to the prior art.

According to the first embodiment, as hereinabove described, the semiconductor laser device having a real refractive index guided structure is so set that the vertical beam divergence angle is at least 15.0° and not more than 20.0°, whereby a higher kink light output and a higher maximum light output can be obtained as compared with the conventional semiconductor laser device having the vertical beam divergence angle exceeding 20.0°.

When the vertical beam divergence angle is set to a level, smaller than 18.0°, causing thermal saturation in advance of COD in the semiconductor laser device having a real refractive index guided structure as hereinabove described, COD can be prevented. It has been experimentally confirmed that a semiconductor laser device formed to have a vertical beam divergence angle of at least 15.0° and not more than 17.0° causes no COD, and hence COD can be reliably prevented when the vertical beam divergence angle is set within this range.

According to the first embodiment, at least either the Al composition (x) of the light guide layers 4a and the barrier layers 4c or the thickness of the light guide layers 4a is changed for adjusting the vertical beam divergence angle as hereinabove described, whereby the vertical beam divergence angle can be readily adjusted without changing the degree of carrier confinement in the active laser 4 and without remarkably changing the lasing wavelength.

(Second Embodiment)

In a semiconductor laser device according to a second embodiment of the present invention, the total thickness of p-type cladding layers (a p-type first cladding layer 5 and a p-type second cladding layer 6) is set to about 2.0 μm, dissimilarly to the aforementioned first embodiment. According to the aforementioned first embodiment, the n-type cladding layer 3 has a thickness of about 2.0 μm, while the p-type cladding layers (the p-type first cladding layer 5 of about 0.2 μm in thickness and the p-type second cladding layer 6 of about 1.3 μm in thickness) have a total thickness of about 1.5 μm. On the other hand, the semiconductor laser device according to the second embodiment includes an n-type cladding layer 3 having a thickness of about 2.0 μm and the p-type cladding layers (the p-type first cladding layer 5 of about 0.2 μm in thickness and the p-type second cladding layer 6 of about 1.8 μm in thickness) have a total thickness of about 2.0 μm. In relation to the second embodiment, samples having four types of vertical beam convergence angles 13.0°, 14.0°, 15.0° and 20.0° were prepared under conditions shown in Table 2.

TABLE 2

| Thickness of Light Guide Layer (nm): t | 20 | 15 | 15 | 15 | 15 |
|---|---|---|---|---|---|
| Al Composition of Light Guide Layer (Barrier Layer): x | 0.39 | 0.45 | 0.57 | 0.62 | 0.67 |
| Vertical Beam Divergence Angle(°) | 22.0 | 20.0 | 15.0 | 14.0 | 13.0 |

Referring to Table 2, at least either Al compositions (x) of light guide layers 4a and barrier layers 4c or thicknesses of the light guide layers 4a were varied thereby adjusting vertical beam divergence angles in the samples according to the second embodiment, similarly to the aforementioned first embodiment. Thus, the samples of the semiconductor laser device according to the second embodiment having the vertical beam divergence angles of 13.0° to 20.0° and the conventional (comparative) semiconductor laser device having the vertical beam divergence angle of 22.0° were prepared for investigating current-light output characteristics.

The current-light output characteristics of the samples of the semiconductor laser device according to the second embodiment and the conventional (comparative) semiconductor laser device are described with reference to FIG. 5. Thicknesses of p-type first cladding layers 5 were set to about 0.2 μm thereby adjusting horizontal beam convergence angles of all samples to about 10°, similarly to the first embodiment. The current-light output characteristics shown in FIG. 5 were measured under conditions of an operating pulse width (pulse width) of 100 ns, an operating pulse ratio (duty) of 50%, a cavity length (L) of 900 μm and reflectivity of 5% and 95% on front and back sides of emission surfaces.

Figure 5:
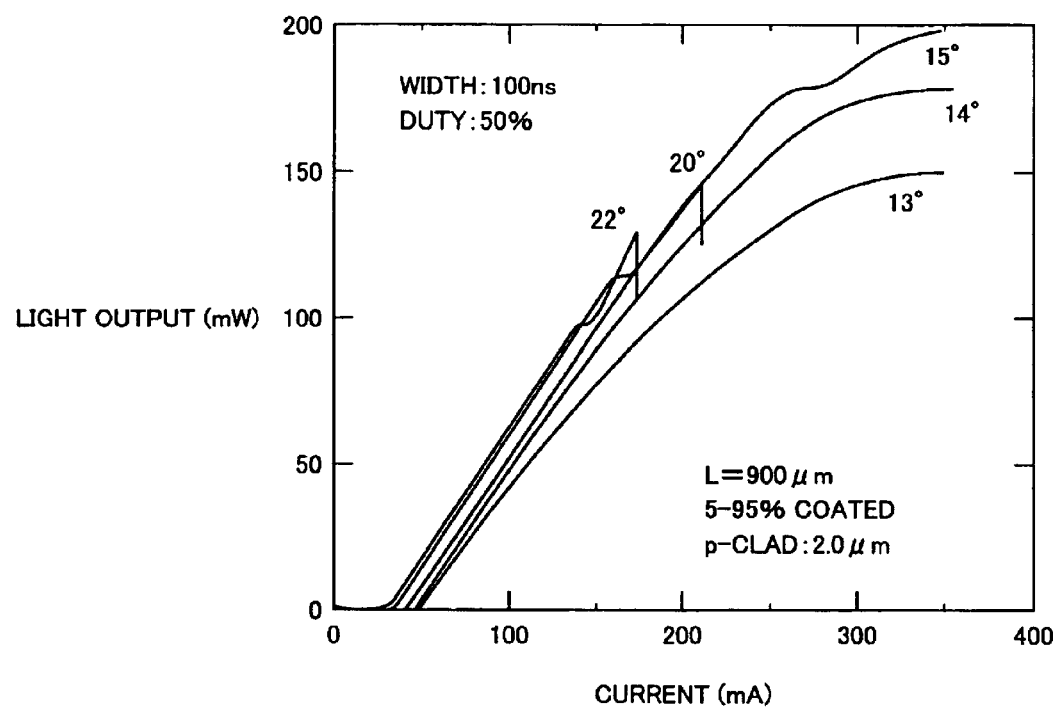
FIG. 5 is a characteristic diagram showing current-light output characteristics of samples of a semiconductor laser device according to a second embodiment of the present invention and a conventional (comparative) semiconductor laser device.

As shown in FIG. 5, the maximum light output of the conventional (comparative) semiconductor laser device having the vertical beam divergence angle of 22.0° is limited to about 130 mW due to COD, similarly to the case shown in FIG. 3 with reference to the first embodiment. On the other hand, it has been proved that COD level of a sample having a vertical beam divergence angle of 20.0° was improved as compared with the COD level of the conventional semiconductor laser device having the vertical beam divergence angle of 22.0° among the samples of the semiconductor laser device according to the second embodiment having the vertical beam divergence angles of 13.0° to 20.0°. More specifically, it was possible to obtain a COD level of at least about 150 mW in the sample having the vertical beam divergence angle of 20.0°.

When the vertical beam divergence angle is at least 13.0° and not more than 15.0°, thermal saturation precedes COD. It has been proved that samples having vertical beam divergence angles of 13.0° to 15.0° obtained higher maximum light outputs (about 150 mW to about 200 mW) than the conventional semiconductor laser device having the divergence angle of 22.0°. The sample having the vertical beam divergence angle of 15.0° obtained a higher kink light output and a higher maximum light output as compared with the conventional semiconductor laser device having the divergence angle of 22.0° although a kink preceded thermal saturation.

As hereinabove described, it has been proved that the semiconductor laser device according to the second embodiment having the vertical beam divergence angle of at least 13.0° and not more than 20.0° obtains a higher kink light output and a higher maximum light output as compared with the conventional semiconductor laser device having the vertical beam divergence angle of 22.0°.

(Third Embodiment)

In a semiconductor laser device according to a third embodiment of the present invention, an n-type cladding layer 3 has a large thickness of 2.5 μm and p-type cladding layers (a p-type first cladding layer 5 and a p-type second cladding layer 6) also have a large total thickness of 2.5 μm, dissimilarly to the aforementioned first and second embodiments.

In order to obtain a stable high-output operation, the width of a lower part of a ridge portion consisting of the p-type second cladding layer 6 must be set to about 3.0 μm. Due to the restriction of the trapezoidal shape of the ridge portion, the upper limit of the total thickness of the p-type cladding layers is about 2.5 μm employed in the third embodiment.

Also in relation to the third embodiment, samples having four types of vertical beam divergence angles 12.5°, 13.5°, 14.5° and 20.0° were prepared under conditions shown in Table 3.

TABLE 3

| Thickness of Light Guide Layer (nm): t | 20 | 15 | 15 | 15 | 15 |
|---|---|---|---|---|---|
| Al Composition of Light Guide Layer (Barrier Layer): x | 0.39 | 0.45 | 0.57 | 0.62 | 0.67 |
| Vertical Beam Divergence Angle(°) | 22.0 | 20.0 | 14.5 | 13.5 | 12.5 |

Referring to Table 3, at least either Al compositions (x) of light guide layers 4a and barrier layers 4c or thicknesses of the light guide layers 4a were varied thereby adjusting vertical beam divergence angles also in the samples according to the third embodiment, similarly to the aforementioned first and second embodiments. Thus, the samples of the semiconductor laser device according to the third embodiment having the vertical beam divergence angles of 12.5° to 20.0° and the conventional (comparative) semiconductor laser device having the vertical beam divergence angle of 22.0° were prepared for investigating current-light output characteristics.

The current-light output characteristics of the samples of the semiconductor laser device according to the third embodiment and the conventional (comparative) semiconductor laser device are described with reference to FIG. 6. Also in relation to the third embodiment, thicknesses of p-type first cladding layers 5 were set to about 0.2 μm thereby adjusting horizontal beam convergence angles of all samples to about 10°. The current-light output characteristics shown in FIG. 6 were measured under conditions of an operating pulse width (pulse width) of 100 ns, an operating pulse ratio (duty) of 50%, a cavity length (L) of 900 μm and reflectivity of 5% and 95% on front and back sides of emission surfaces.

Figure 6:
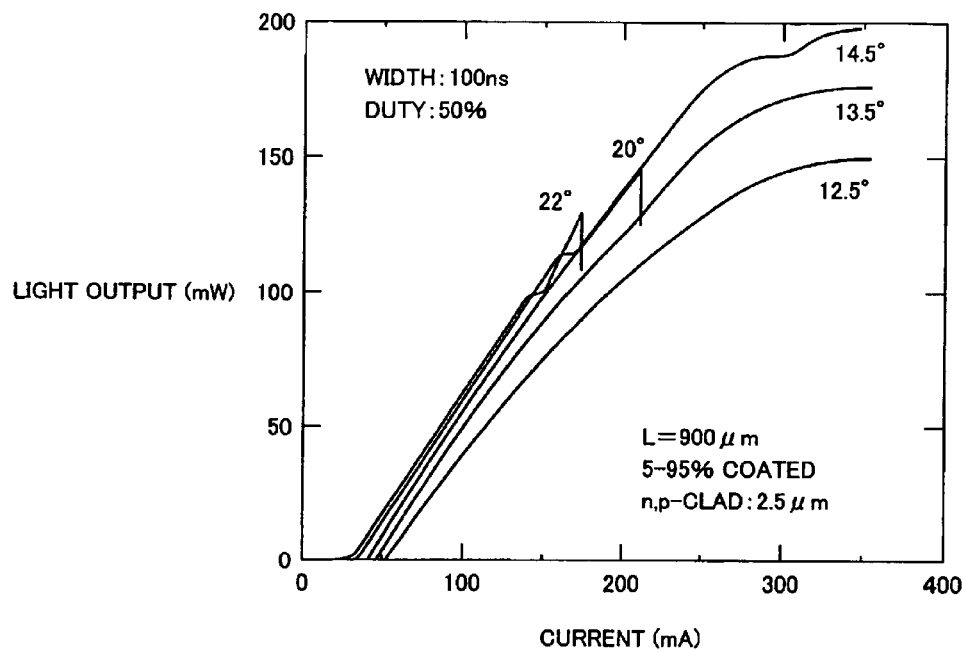
FIG. 6 is a characteristic diagram showing current-light output characteristics of samples of a semiconductor laser device according to a third embodiment of the present invention and a conventional (comparative) semiconductor laser device.

As shown in FIG. 6, the maximum light output of the conventional (comparative) semiconductor laser device having the vertical beam divergence angle of 22.0° is limited to about 130 mW due to COD. On the other hand, it has been proved that COD level of a sample having a vertical beam divergence angle of 20.0° was improved as compared with the COD level of the conventional semiconductor laser device having the vertical beam divergence angle of 22.0° among the samples of the semiconductor laser device according to the third embodiment having vertical beam divergence angles of 12.5° to 20.0°. More specifically, it was possible to obtain a COD level of at least about 150 mW in the sample having the vertical beam divergence angle of 20.0°.

When the vertical beam divergence angle is at least 12.5° and not more than 14.5°, thermal saturation precedes COD. It has been proved that samples having vertical beam divergence angles of 12.5° to 14.5° obtained higher maximum light outputs (about 150 mW to about 200 mW) than the conventional semiconductor laser device having the divergence angle of 22.0°. The sample having the vertical beam divergence angle of 14.5° obtained a higher kink light output and a higher maximum light output as compared with the conventional semiconductor laser device having the divergence angle of 22.0° although a kink preceded thermal saturation.

As hereinabove described, it has been proved that the semiconductor laser device according to the third embodiment having the vertical beam divergence angle of at least 12.5° and not more than 20.0° obtains a higher kink light output and a higher maximum light output as compared with the conventional semiconductor laser device having the vertical beam divergence angle of 22.0°.

Figure 7:
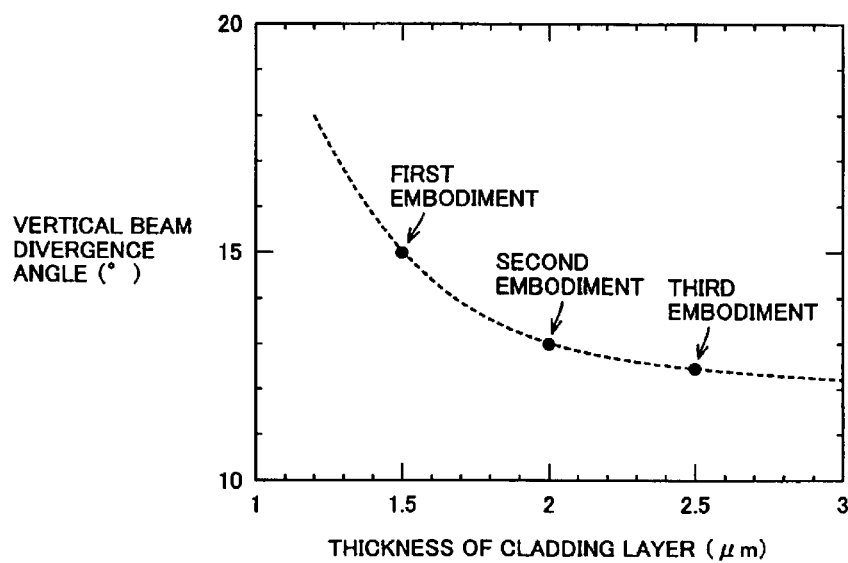
FIG. 7 is a characteristic diagram showing the relation between the thicknesses of cladding layers in the semiconductor laser devices according to the first to third embodiments of the present invention and vertical beam divergence angles.

The relation between the thickness of any cladding layer in each of the aforementioned first to third embodiments and a minimum vertical beam divergence angle for obtaining a maximum light output of at least about 150 mW higher than that in the conventional semiconductor laser device having the vertical beam divergence angle of 22.0° is now described with reference to FIG. 7. Referring to FIG. 7, the horizontal axis shows the thickness of the n-type cladding layer 3 or the p-type cladding layers (the p-type first cladding layer 5 and the p-type second cladding layer 6) exhibiting a smaller thickness in each of the first to third embodiments. It is understood from FIG. 7 that the minimum vertical beam divergence angle is reduced as the thickness of the cladding layer is increased. It is also understood that reduction of the minimum vertical beam divergence angle is stopped at about 12.0°.

It is further understood that the minimum vertical beam divergence angle for obtaining a maximum light output of at least about 150 mW higher than that in the conventional semiconductor laser device having the vertical beam divergence angle of 22.0° is in the range of at least 12.5° and not more than 15.0° when the thickness of the cladding layer is set to at least 1.5 μm and not more than 2.5 μm. Thus, a low aspect ratio can be implemented while maintaining a maximum light output exceeding that of the conventional semiconductor laser device by setting the thickness of the cladding layer and the vertical beam divergence angle in the ranges of at least 1.5 μm and not more than 2.5 μm and at least 12.5° and not more than 15.0° respectively.

Although the present invention has been described and illustrated in detail, it is clearly understood that the same is by way of illustration and example only and is not to be taken by way of limitation, the spirit and scope of the present invention being limited only by the terms of the appended claims.

For example, while the p-type second cladding layer 6 is formed on the p-type first cladding layer 5 in each of the aforementioned embodiments, the present invention is not restricted to this but an etching stop layer consisting of GaInP may be provided between the p-type first cladding layer 5 and the p-type second cladding layer 6 for improving etching controllability in formation of the ridge portion.

What is claimed is:

1. A semiconductor laser device having a real refractive index guided structure, comprising:

a n-type cladding layer of AlGaInP formed on an n-type GaAs substrate;

an active layer having an AlGaInP layer formed on said n-type cladding layer;

a p-type cladding layer of AlGaInP formed on said active layer; and a light confinement layer formed to partially cover said p-type cladding layer, wherein a laser beam emitted form the device has a vertical beam divergence angle is of at least 12.5° and not more than 20.0°0.

2. The semiconductor laser device according to claim 1, wherein said vertical beam divergence angle is an angle exhibiting thermal saturation before a laser beam emitting end face is deteriorated.

3. The semiconductor laser device according to claim 2, wherein said vertical beam divergence angle is smaller than 18°.

4. The semiconductor laser device according to claim 3, wherein said vertical beam divergence angle is at least 12.5° and not more than 17.0°.

5. The semiconductor laser device according to claim 4, wherein said vertical beam divergence angle is at least 15.5°.

6. The semiconductor laser device according to claim 1, wherein said n-type cladding layer or said p-type cladding layer having a smaller thickness is at least 1.5 μm and not more than 2.5 μm in thickness.

7. The semiconductor laser device according to claim 1, wherein said active layer includes a light guide layer and a barrier layer, for adjusting said vertical beam divergence angle by changing at least either the Al composition of said light guide layer and said barrier layer or the thickness of said light guide layer.

8. The semiconductor laser device according to claim 1, wherein said active layer includes a light guide layer and a barrier layer, the composition ratio Al/(Al+Ga) of said light guide layer and said barrier layer is at least 0.39 and not more than 0.67, and the thickness of said light guide layer is at least 15 nm and not more than 25 nm.

9. The semiconductor laser device according to claim 1, wherein said active layer has a quantum well structure, and an impurity is introduced into a region of said active layer close to a cavity end face thereby disordering said quantum well structure and widening a band gap as compared with the remaining regions.

10. The semiconductor laser device according to claim 1, having a maximum light output of at least 150 mW.

11. A semiconductor laser device having a real refractive index guided structure, comprising:

an n-type cladding layer of AlGaInP formed on an n-type GaAs substrate;

an active layer having a AlGaInP layer formed on said n-type cladding layer;

a p-type cladding layer of AlGaInP formed on said active layer; and a light confinement layer formed to partially cover said p-type cladding layer, wherein said n-type cladding layer or said p-type cladding layer having a smaller thickness is at least 1.5 μm and not more than 2.5 μm thickness, and a laser beam emitted from the device has a vertical beam divergence angle of at least 12.5° and not more than 15.0°.

12. A semiconductor laser device having a real refractive index guided structure, comprising:

an n-type cladding layer of AlGaInP formed on an n-type GaAs substrate;

an active layer having an AlGaInP layer formed on said n-type cladding layer;

a p-type cladding layer of AlGaInP formed on said active layer; and a light confinement layer formed to partially cover said p-type cladding layer, wherein a laser beam emitted from the device has a vertical beam divergence angle of at least 15.0° and not more than 20.0°.

13. The semiconductor laser device according to claim 12, wherein said vertical beam divergence angle is smaller than 18°.

14. The semiconductor laser device according to claim 13, wherein said vertical beam divergence angle is at least 15.0° and more than 17.0°.

15. The semiconductor laser device according to claim 12, wherein said active layer has a quantum well structure, and an impurity is introduced into a region of said active layer close to a cavity end face thereby disordering said quantum well structure and widening a band gap as compared with the remaining regions.

* * * * *